United States Patent [19]

Li

[11] Patent Number: 5,601,656
[45] Date of Patent: Feb. 11, 1997

[54] METHODS FOR CLEANING SILICON WAFERS WITH AN AQUEOUS SOLUTION OF HYDROFLUORIC ACID AND HYDRIODIC ACID

[75] Inventor: Li Li, Meridian, Id.

[73] Assignee: Micron Technology, Inc., Boise, Id.

[21] Appl. No.: 530,940

[22] Filed: Sep. 20, 1995

[51] Int. Cl.$^6$ ................................ B08B 3/04; B08B 3/08
[52] U.S. Cl. ......................................... 134/2; 134/3
[58] Field of Search ........................... 134/1, 1.3, 2, 3; 252/79.1, 79.2, 79.3; 437/225, 228, 230, 238, 240

[56] References Cited

U.S. PATENT DOCUMENTS

| | | | |
|---|---|---|---|
| 4,040,892 | 8/1977 | Sargent et al. | 252/79.2 |
| 4,110,237 | 8/1978 | Matsumoto et al. | 252/79.4 |
| 5,300,463 | 4/1994 | Cathey et al. | 437/238 |

OTHER PUBLICATIONS

J. H. Eisenbeerg et al., Effect of Hot Water Exposure On Bare Silicon Surfaces in MOS Processing, pp. 485–490; Mat. Res. Soc. Symp, Proc; vol. 315 (1993).

L. Li, G. Zou, H. Bender, P. W. Mertens, M. Meuris, H. F. Schmidt and M. M. Heyns; Proceedings of the Second International Symposium on Ultra–Clean Processing of Silicon Surfacaes,; pp. 167–170; (Sep. 17, 1994).

Hitoshi Morinaga, Makoto Suyama, Masashi Nose, Steven Verraverbeke and Tadahiro Ohmi, *Metallic Particle Growth on Si Wafer Surfaces in Wet Chemical Processing and Its Prevention*, 1994 Proceedings— Institute of Environmental Sciences, pp. 332–337.

Tae–Hoon Park, Yong–Sun Ko, Tae–Earn Shim, Jong–Gil Lee, and Young–Kwan Kim, *The Cleaning Effects of $HF$–$HNO_3$–$H_2O_2$ System*, J. Electrochem. Soc., vol. 142, No. 2, Feb. 1995, pp. 571–576.

*Primary Examiner*—Jill Warden
*Assistant Examiner*—Alexander Markoff
*Attorney, Agent, or Firm*—Workman, Nydegger & Seeley

[57] ABSTRACT

Methods are disclosed for cleaning silicon wafers with an aqueous solution of hydrofluoric acid and hydriodic acid. The methods involve cleaning a silicon wafer in an aqueous solution of hydrofluoric acid and hydriodic acid to prevent the deposition of copper contaminants within the solution from being deposited onto the surfaces of the silicon wafer while minimizing oxidation of the surfaces of the silicon wafer. The aqueous solution of hydrofluoric acid and hydriodic acid preferably has sufficient hydriodic acid to cause no dissociation of the hydrofluoric acid.

18 Claims, 3 Drawing Sheets

METHODS FOR CLEANING SILICON WAFERS WITH AN AQUEOUS SOLUTION OF HYDROFLUORIC ACID AND HYDRIODIC ACID

BACKGROUND OF THE INVENTION

1. The Field of the Invention

The present invention is directed to methods for cleaning silicon wafers with an aqueous solution of hydrofluoric acid and hydriodic acid. Treatment of silicon wafers with an aqueous solution of hydrofluoric acid and hydriodic acid prevents copper deposition on the surfaces of the silicon wafers while minimizing the reoxidation of the silicon surfaces of the wafers.

2. The Relevant Technology

In the microelectronics industry, methods for cleaning silicon wafers are continually being developed and optimized to meet the stringent demands for wafers having clean and smooth surfaces. As the device features continuously decrease to the deep sub-micron region, the product yield and device performance become even more dependent on the wafer cleaning technology.

A clean, chemically stable, and atomically uniform silicon surface is an essential requirement prior to gate oxidation and silicon epitaxial growth in advanced ultra large-scale integration (ULSI) fabrication. It is well-known that metallic contamination on silicon surfaces can cause fatal effects on semiconductor devices. The metallic contamination on a silicon surface is preferably suppressed to less than 1E+10 atoms/cm$^2$ in order to prevent defects. Wet chemical processing has been used as a major cleaning method in ULSI manufacturing; however, it has become increasingly sufficient to minimize metallic contamination using conventional cleaning methods such as RCA cleaning and hydrofluoric acid (HF) cleaning.

Hydrofluoric acid cleaning has been the main approach over the last few years for obtaining a clean, chemically stable, and atomically uniform silicon surface. After aqueous hydrofluoric acid treatment, a hydrogen-passivated bare silicon surface is obtained. Hydrofluoric acid treatment removes thermal and native oxides and is therefore an essential processing step of device fabrication and is a basic component of all kinds of cleaning procedures.

During hydrofluoric acid wafer cleaning, metals including noble metals, have been found deposited on wafer surfaces by oxidation-reduction reactions resulting in severely deteriorated device performances. Copper (Cu) deposition has been a particular problem.

The reaction in which a Cu$^{2+}$ ion in a solution is metalized by taking electrons can be expressed by the following oxidation-reduction reaction equation: Cu$^{2+}$+2e$^-$=Cu. The redox potential (E°) of the metallization of a Cu$^{2+}$ ion is 0.337 V. The electrons are considered to be supplied by the silicon.

The reaction in which silicon in an aqueous solution releases electrons can be expressed by the following equation: SiO$_2$+4H$^+$+4e$^-$=Si+2H$_2$O. The redox potential for the reaction of silicon in an aqueous solution is −0.857 V. A Cu$^{2+}$ ion, which has a higher redox potential than silicon, takes electrons, is reduced to metallic copper, and is deposited onto a silicon surface. Silicon, which features a lower redox potential than the Cu$^{2+}$ ion, releases electrons and is oxidized to become silicon dioxide (SiO$_2$). The copper deposition onto a silicon surface in the solution is essentially induced by the oxidation-reduction reaction between silicon and copper ions. Pits found where copper particles deposit on the silicon surface in a diluted hydrofluoric acid solution provides evidence of this SiO$_2$ formation.

A pit produced when silicon dioxide (SiO$_2$) formed in the oxidation-reduction reaction is etched away by a diluted hydrofluoric acid solution is referred to as a Metal Induced Pit (MIP). The mechanism of copper deposition onto silicon surfaces in solutions begins with Cu$^{2+}$ ions in the vicinity of a silicon surface withdrawing electrons from the silicon and becoming precipitated in a form of metallic copper (Cu). It has been postulated that a nucleus of a copper particle is formed. As the copper nucleus adhering on the silicon surface features higher electronegativity than silicon, it attracts electrons from the silicon to become negatively charged. Other copper ions coming closer to the silicon surface gain electrons from the negatively-charged (electron-rich) copper nucleus and are precipitated around it. Accordingly, the copper nucleus grows into a larger particle on the silicon surface as more copper ions are precipitated. The silicon surface underneath the copper particles releases as many electrons as required by Cu$^{2+}$ ions to be charged while SiO$_2$ is thereby formed. In a diluted hydrofluoric acid solution, the formed SiO$_2$ is etched away immediately and a pit is made.

The copper nucleus is considered to be made where a silicon surface is electrically active. Electron exchange between copper ions and silicon is more likely to take place at kinks, steps, and areas where halide ions are adsorbed because these areas are more electrically active than the hydrogen-terminated areas on a silicon surface. The promotion of copper deposition by a trace level of halogen ions in hydrofluoric acid solutions can be explained by this mechanism.

A typical pit formed from metallic impurities is about 0.1 μm in diameter, which is also almost the same as the copper particle size. The depth of a typical pit from peak to valley is about 8 nm. The pit size can be fatal to device performance when it is considered that the thickness of a typical gate oxide is 8 to 15 nm.

Copper deposition has been prevented by the addition of strong oxidizing agents such as ozone and hydrogen peroxide. Strong oxidizing agents such as ozone and hydrogen peroxide are useful for the prevention of copper deposition; however, the surface of the silicon wafers are also thereby reoxidized.

There are no methods currently available which provide for the prevention of copper deposition and also the minimization of silicon surface reoxidation.

SUMMARY AND OBJECTS OF THE INVENTION

The present invention is directed to methods for cleaning silicon wafers with an aqueous solution of hydrofluoric acid and hydriodic acid. Treatment of silicon wafers with a solution of hydrofluoric acid and hydriodic acid prevents metal deposition on the surfaces of the silicon wafers, particularly copper deposition, while minimizing the reoxidation of the silicon surfaces of the wafers.

The methods of the present invention comprise the steps of obtaining a silicon wafer, cleaning the silicon wafer in an aqueous solution of hydrofluoric acid and hydriodic acid.

A simultaneous oxidation and etching process takes place in the aqueous HF/HI solution resulting in an increased (111) microfaceting of a Si(100) surface. The silicon surface of a wafer treated in the aqueous HF/HI solution, however, remains hydrogen passivated since the surface oxide is continuously removed by the hydrofluoric acid. The oxidation of the silicon surfaces of the wafers is minimized as the surfaces are reoxidized less than would occur in a hydrofluoric acid solution with a strong oxidizing agent such as hydrogen peroxide or ozone.

The scope of the present invention includes the prevention or minimization of metallic deposition onto silicon surfaces of a wafer by metals which are metallized from metal ions within an aqueous solution by a reaction having an electrochemical potential less than the electrochemical potential for the reaction, $I_2 + 2e^- = 2I^-$, which is 0.54 V. Copper has an electrochemical potential of 0.34 V. Consequently, copper ions are prevented from forming into copper and being deposited onto the silicon wafer surfaces.

From the foregoing it will be appreciated that an object of the present invention is to provide methods for cleaning a silicon wafer without depositing metal contaminants such as copper onto the surfaces of the silicon wafer.

It is also an object of the present invention to provide methods for cleaning a silicon wafer that prevent metal deposition while minimizing reoxidation of the surfaces of the silicon wafer.

These and other objects and features of the present invention will become more fully apparent from the following description and appended claims, or may be learned by the practice of the invention as set forth hereinafter.

BRIEF DESCRIPTION OF THE DRAWINGS

In order to understand the manner in which the above-recited and other advantages and objects of the invention are obtained, a more particular description of the invention briefly described above will be rendered by reference to the appended drawings. Understanding that these drawing depict only a typical embodiment of the invention and are not therefore to be considered to be limiting of its scope, the invention will be described and explained with additional specificity and detail through the use of the accompanying drawings listed hereinbelow.

DETAILED DESCRIPTION OF THE PREFERRED EMBODIMENTS

Figure 1:
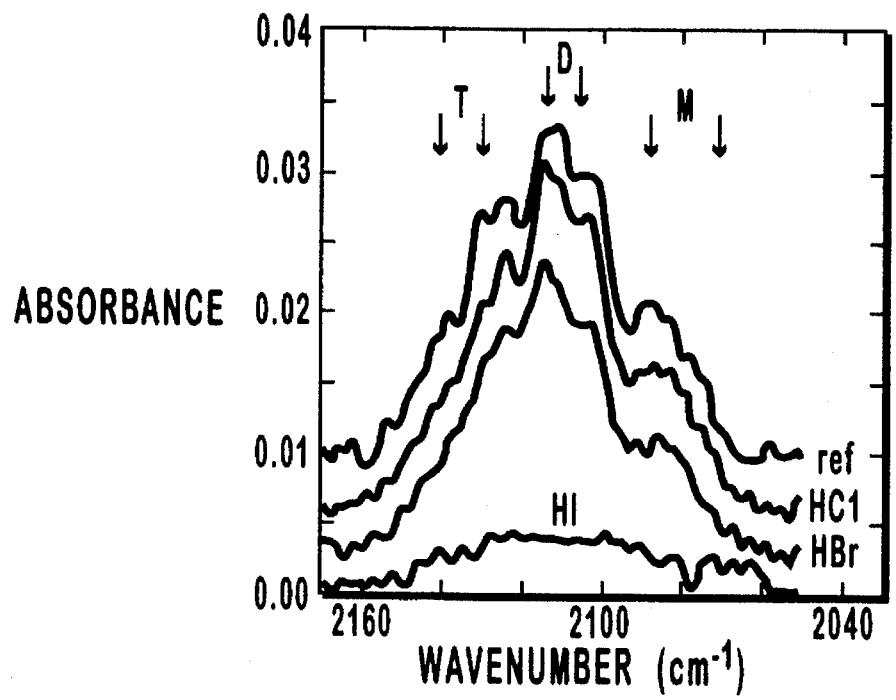
FIG. 1 is a p-polarized Multiple Internal Reflection spectra of the $SiH_x$ stretching vibration of four wafers including a wafer dipped for six minutes in 0.5% HF as a reference, a wafer etched for thirty minutes in 0.25M HCl, a wafer etched for thirty minutes in 0.25M HBr, and a wafer etched for thirty minutes in 0.25M HI. The vibration modes of the monohydrides, dihydrides and trihydrides are indicated respectively as (M), (D), (T).

The present invention is directed to methods for cleaning silicon wafers with an aqueous solution of hydrofluoric acid and hydriodic acid. Treatment of silicon wafers with an aqueous solution of hydrofluoric acid and hydriodic acid prevents metal deposition on the surfaces of the silicon wafers, particularly copper deposition, while minimizing the reoxidation of the silicon surfaces of the wafers.

Hydriodic acid (HI) is totally disassociated to $H^+$ and iodine ions ($I^-$) in an aqueous hydriodic acid solution. Iodine ions ($I^-$) are easily oxidized by oxygen from the air when catalyzed by light to form $I_2$ in the HI/HF solution. The electrochemical potential ($E°$) for the reaction, $I_2 + 2e^- = 2I^-$, is 0.54 V. The reaction in which the $Cu^{2+}$ ion in the solution is metallized by taking electrons is expressed by the following oxidation-reduction reaction, $Cu^{2+} + 2e^- = Cu$, and the electrochemical potential for the reaction is 0.34 V. The electrochemical potential for the formation of copper is lower than the electrochemical potential for the iodine reaction thereby preventing the deposition of copper on silicon wafer surfaces.

The scope of the present invention includes the prevention or minimization of metallic deposition onto silicon surfaces of wafers by metals which are metallized from metal ions within an aqueous solution by a reaction having an electrochemical potential less than the electrochemical potential for the reaction, $I_2 + 2e^- = 2I^-$.

In addition to preventing the deposition of copper, a solution of hydrofluoric acid and hydriodic acid minimizes reoxidation of the surfaces of silicon wafers compared to the use of hydrogen peroxide and ozone in combination with hydrofluoric acid. $I_2$ is a medium strength oxidizing agent but is a much weaker oxidizing agent than hydrogen peroxide and ozone. The electrochemical potential for the reaction $H_2O_2 + 2H^+ + 2e^- = 2H_2O$ is 1.77 V the electrochemical potential for the reaction $O_3 + 2H^+ + 2e^- = O_2 + H_2O$ is 2.07 V. A hydrogen passivated silicon surface is more easily obtained in a solution of hydrofluoric acid and hydriodic acid than in a solution of hydrofluoric acid and either hydrogen peroxide or ozone since hydrogen peroxide and ozone have such high electrochemical potentials.

Since hydrofluoric acid is a weak acid which only partially dissociates in an aqueous solution, the $SiO_2$ etching mechanism changes depending on which fluorine species dominates the surface cleaning process. For low pH, the main components in the solution are hydrofluoric acid and $(HF)_2$, while for higher pH $HF_2^-$ dominates. Because the $H^+$ concentration in diluted aqueous hydrofluoric acid is low, having a pH level of about 3, the dissolution of the metallic surface contamination into the solution is not very efficient. In contrast to hydrofluoric acid, hydriodic acid is a strong acid in water. Addition of hydriodic acid to an aqueous hydrofluoric acid solution strongly influences the dissociation of the hydrofluoric acid and lowers the pH of the solution to less than 3, and preferably to less than 1. Adding hydriodic acid to aqueous hydrofluoric acid solutions suppresses the concentration of $HF_2^-$, and results in a more uniform $SiO_2$ etching.

When $I_2$ is consumed in an aqueous solution of hydrofluoric acid and hydriodic acid by the reaction $I_2 + 2e^- = 2I^-$, the $I_2$ is regenerated through the reaction between $I^-$ and oxygen from the air which is catalyzed by light. Accordingly, a constant concentration of $I_2$ is automatically maintained in the solution.

The aqueous solution of hydrofluoric acid and hydriodic acid preferably has sufficient hydriodic acid to reduce substantial HF dissociation. When the hydrofluoric acid concentration is about 0.25M and the hydriodic acid concentration is about 0.25M, the solution has a pH level which is less than one thereby effectively controlling the HF dissociation and effectively removing metallic contaminants.

EXAMPLES OF THE PRESENT INVENTION

A series of experiments were conducted to compare the surface properties of silicon wafers treated by HI solutions with the surface properties of silicon wafers treated by other hydrohalic acids alone or in solution with hydrofluoric acid. The surface properties compared in these series of experiments include the amount of reoxidation and the roughness.

The series of experiments was performed on p-type Si(100) samples having a resistivity between 16 to 24 $\Omega \cdot$cm. The wafers were first SC1 cleaned and then etched in an aqueous 0.25M (0.5%) hydrofluoric acid solution for six minutes to remove the chemical oxide. After the wafers were rinsed in the aqueous hydrofluoric acid they were rinsed in deionized (DI) water to remove the fluorine residues before the samples were further treated in the hydrohalic acid solutions. The silicon surface state after each treatment was studied by means of multiple internal reflection infrared spectroscopy (MIR) in a Fourier transform infrared system (FTIR) within half an hour after sample preparation. The infrared spectroscopy measurements were performed to obtain information on the surface hydrogen passivation and surface microroughness by observation of the relative amounts of monohydrides, dihydrides, and trihydrides on the HF-treated silicon surfaces. Atomic Force Microscopy (AFM) was used to study the roughness of the samples after the different etchings. The silicon etching rate was obtained from cross-sectional transmission electron microscopy (TEM) on patterned oxide structures.

EXAMPLE 1

Experiments were conducted to compare the hydrogen surface passivation and the microroughness of silicon wafers treated in hydrochloric acid, hydrobromic acid and hydriodic acid. Bare samples were dipped in a 0.25M HX (X=Cl, Br, I)/DI water solution for thirty minutes. A reference sample was provided by etching a silicon wafer in only aqueous HF for six minutes.

The MIR spectra for the different treatments are shown in FIG. 1 with the spectra shifted along the ordinate for better presentation. It is known that flat (100) and (111) silicon surfaces are mainly terminated respectively by dihydrides and monohydrides. The long immersion in the HCl and HBr solutions did not change the hydrogen surface passivation compared to the HF reference sample. Accordingly, treatment of silicon wafers in the HCl and HBr solutions yields a surface microroughness which is similar to the microroughness of the Si (100) surfaces treated for six minutes. The hydride signal for the HI-treated sample was very weak and showed no clearly resolved peaks of the different hydrides. As it was noticed that the wafer treated in the HI solution was hydrophilic, it can be concluded that the silicon surface is reoxidized in the HI solution.

The surface roughness of these samples was further examined by AFM measurements which showed that the thirty minute immersion in the 0.25M HX (X=Cl, Br) solutions did not change the roughness on the HF-etched bare silicon surface. The rms surface roughnesses after the treatments in these hydrohalic acid solutions were identical to that of the reference sample, 0.14 nm. Although the reoxidation diminishes the surface passivation during the immersion in the HI solution, the surface roughness was not altered compared to the treatments in the other solutions as it was only 0.12 nm.

EXAMPLE 2

Silicon wafers were treated in aqueous HF/HX (X=Cl, Br, I) solutions. The silicon wafers were treated for thirty minutes in 0.25M HF/0.25M HX (X=Cl, Br, I) solutions and then compared with a reference sample treated for six minutes in aqueous hydrofluoric acid.

Figure 2:
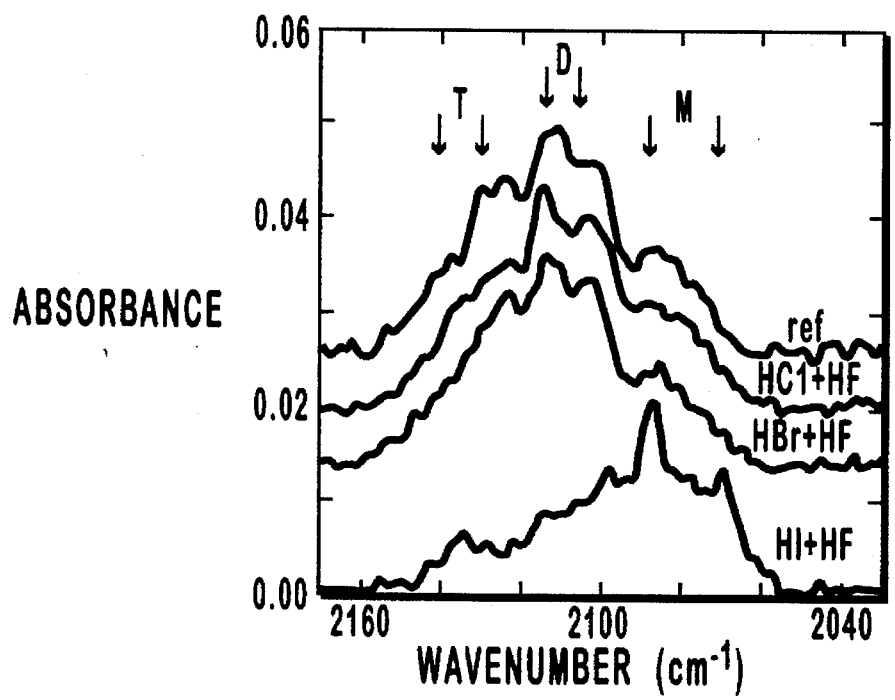
FIG. 2 is a p-polarized Multiple Internal Reflection spectra of the $SiH_x$ stretching vibration of four wafers including a wafer dipped for six minutes in 0.5% HF as a reference, a wafer etched for thirty minutes in 0.25M HF/0.25M HCl, a wafer etched for thirty minutes in 0.25M HF/0.25M HBr, and a wafer etched for thirty minutes in 0.25M HF/0.25M HI. The vibration modes of the monohydrides, dihydrides and trihydrides are indicated respectively as (M), (D), (T).
Figure 3A:
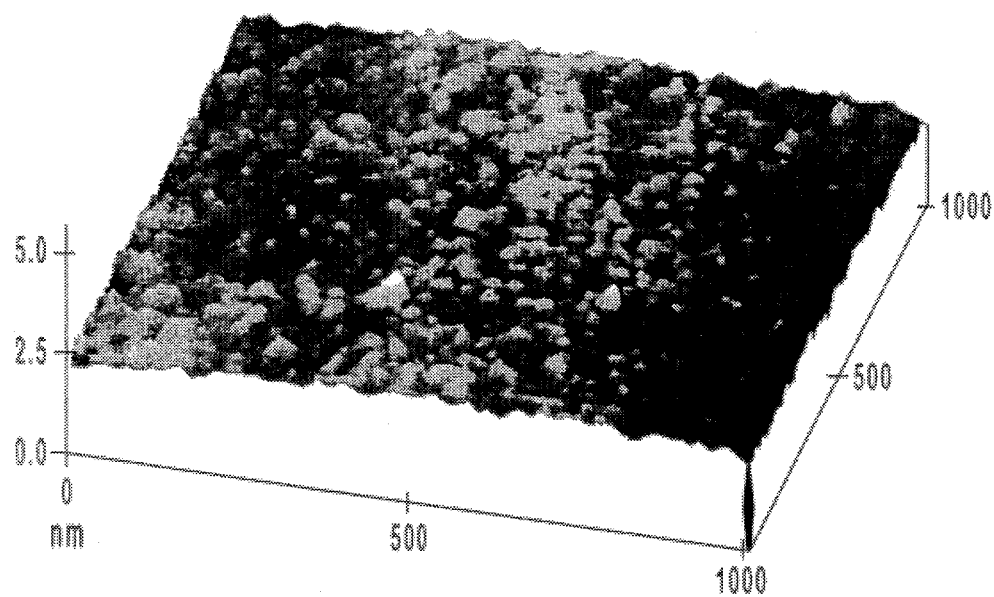
FIG. 3a is an Atomic Force Microscope image showing the profile of a wafer treated for six minutes in 0.5% HF as a reference.
Figure 3B:
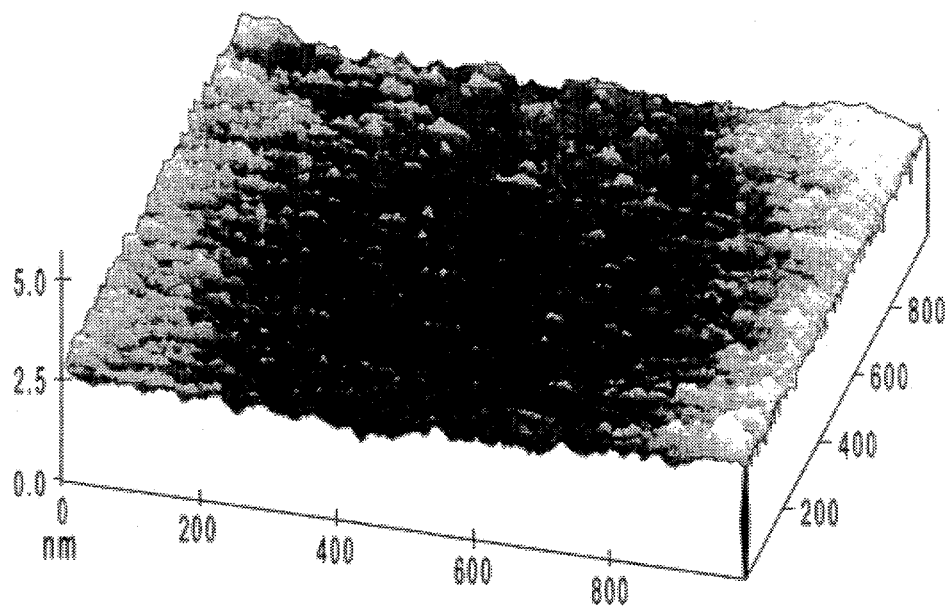
FIG. 3b is an Atomic Force Microscope image showing the profile of a wafer treated for thirty minutes in 0.25M HF/0.25M HCl.
Figure 3C:
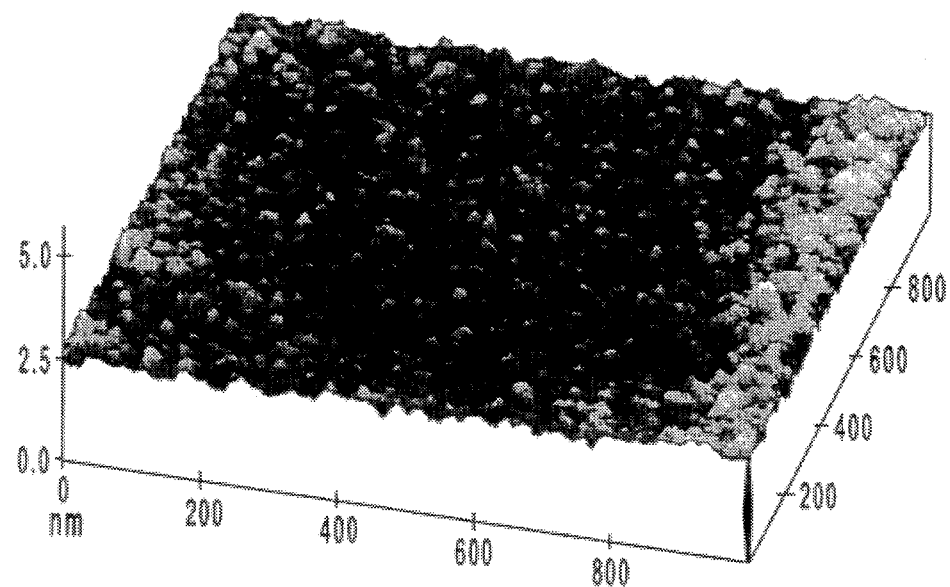
FIG. 3c is an Atomic Force Microscope image showing the profile of a wafer treated for thirty minutes in 0.25M HF/0.25M HBr.
Figure 3D:
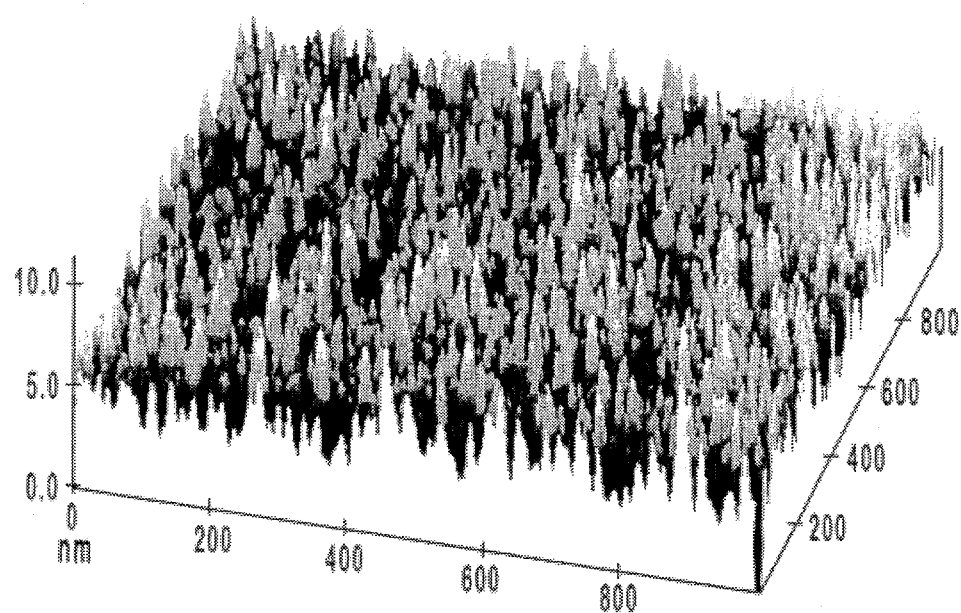
FIG. 3d is an Atomic Force Microscope image showing the profile of a wafer treated for thirty minutes in 0.25M HF/0.25M HI.

The MIR spectra for the different treatments are shown in FIG. 2 with the spectra shifted along the ordinate for better presentation. The MIR spectra show that the silicon surface passivation of the wafers treated in either HF/HCl or HF/HBr are comparable with the silicon surface passivation of the wafer treated in only HF. The surface passivation of the wafer treated in the 0.25M HF/0.25M HI solution is significantly changed as the spectrum shifts from dihydride dominated to monohydride dominated. The shift indicates the formation of (111)-oriented microfacets on the surface. The simultaneous oxidation by the iodine components and etching by the fluorine components in the solution caused the increase in microroughness. The silicon surface of the wafer treated in the HF/HI solution, however, remained hydrogen passivated since the surface oxide was continuously removed by HF.

AFM images are shown in FIGS. 3a–3d for the reference sample and for the samples treated in the 0.25M HF/0.25M HX (X=Cl, Br, I) solutions respectively. The AFM images show that there was no change in the surface microroughness after immersion in the 0.25M HF/0.25M HX (X=Cl or Br) solutions, but that a significant increase of the surface roughness occurred by the treatment in 0.25M HF/0.25M HI. The rms surface roughness was 0.19 nm for the HF/HCl solution, 0.12 nm for the HF/HBr solution and 1.05 nm for the HF/HI solution. The rms for the silicon wafer treated in the HF/HI solution was about one order of magnitude higher than the rms for the other treatments. The aqueous HF/HI solutions of the present invention tend to roughen a Si(100) surface due to a simultaneous oxidation/etching process.

The surface properties observed for the silicon wafers treated in an aqueous solution of HF/HX (X=Cl, Br, I) can be explained by a comparison with the surface results obtained in pure water. It is known that pure water anisotropically etches a hydrogen-passivated silicon surface. It has been suggested that the reaction path involves a slow nucleophilic attack of $OH^-$ on the surface Si—H bond producing Si—OH, followed by an attack of water on the polarized Si—SiOH back bond. The $OH^-$ concentration in the 0.25M HX (X=Cl, Br, I) solutions was too low to cause a surface etch effect similar to that in pure water as HX (X=Cl, Br, I) are all strong acids. However, $Cl^-$, $Br^-$, and $I^-$ are also potential nucleophiles, and their concentrations in 0.25M HX (X=Cl, Br, I) solutions are 6–7 orders of magnitude higher than that of $OH^-$ in pure water. However, no apparent surface etching resulted on the wafers treated in the aqueous HF/HX (X=Cl, Br, I) solutions. There are several possible explanations for the minimal etching. It is postulated that the $Cl^-$, $Br^-$, and $I^-$ are less powerful nucleophiles than $OH^-$ and they do not substitute the surface hydrogen as easily so that less SiX (X=Cl, Br, I) is formed on the surface than SiOH on water-attached surfaces. Additionally, Cl, Br, and I are less electronegative than O causing the Si—SiX (X=Cl, Br, I) back bond to be less polarized and therefore not readily attacked by water to dissolve the SiX group.

The reaction kinetics or thermodynamics of silicon surface etching in the HX (X=Cl, Br, I) solutions can probably be observed at higher temperatures or higher concentrations, but it was absent in these series of cleaning experiments conducted at normal room-temperature.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of cleaning a silicon wafer comprising the steps of:
    cleaning a silicon surface of the silicon wafer in an aqueous solution of hydrofluoric acid and hydriodic acid in the presence of oxygen and light, wherein the aqueous solution of hydrofluoric acid and hydriodic acid has a concentration of hydrofluoric acid of about 0.1M–10M and has a concentration of hydriodic acid of about 0.001M–1M.

2. A method of cleaning a silicon wafer as defined in claim 1, wherein the step of cleaning a silicon surface of the silicon wafer in the aqueous solution of hydrofluoric acid and hydriodic acid in the presence of oxygen and light is conducted for a period of time sufficient to substantially prevent the deposition of noble metals onto the silicon surface of the silicon wafer while cleaning said silicon surface.

3. A method of cleaning a silicon wafer as defined in claim 1, wherein the step of cleaning a silicon surface of the silicon wafer in the aqueous solution of hydrofluoric acid and hydriodic acid in the presence of oxygen and light is conducted for a period of time sufficient to substantially prevent the deposition of noble metals while minimizing oxidation of the silicon surface of the silicon wafer while cleaning said silicon surface.

4. A method of cleaning a silicon wafer as defined in claim 1, wherein the step of cleaning a silicon surface of the silicon wafer in the aqueous solution of hydrofluoric acid and hydriodic acid in the presence of oxygen and light is conducted for a period of time sufficient to substantially prevent the deposition onto the silicon surface of metals which are metallized from metal ions within the aqueous solution while cleaning said silicon surface by a reaction having an electrochemical potential less than the electrochemical potential for the reaction, $I_2+2e^-=2I^-$, which is 0.54 V.

5. A method of cleaning a silicon wafer as defined in claim 1, wherein the step of cleaning a silicon surface of the silicon wafer in the aqueous solution of hydrofluoric acid and hydriodic acid in the presence of oxygen and light is conducted for a period of time sufficient to substantially prevent the deposition of copper on the silicon surface of the silicon wafer while cleaning said silicon surface.

6. A method of cleaning a silicon wafer as defined in claim 1, wherein the aqueous solution of hydrofluoric acid and hydriodic acid has a pH level of less than 3.

7. A method of cleaning a silicon wafer as defined in claim 1, wherein the aqueous solution of hydrofluoric acid and hydriodic acid has a pH level of less than 1.

8. A method of cleaning a silicon wafer as defined in claim 1, wherein the aqueous solution of hydrofluoric acid and hydriodic acid has sufficient hydriodic acid to cause substantially no dissociation of the hydrofluoric acid.

9. A method of cleaning a silicon wafer comprising the step of:
    cleaning a silicon surface of the silicon wafer in an aqueous solution of hydrofluoric acid and hydriodic acid in the presence of oxygen and light, for a period of time sufficient to substantially prevent copper contaminants within the aqueous solution from being deposited onto the silicon surface of the silicon wafer while cleaning said silicon surface, wherein the aqueous solution of hydrofluoric acid and hydriodic acid has a pH level of less than 3, has a concentration of hydrofluoric acid of about 0.1M–10M and has a concentration of hydriodic acid of about 0.001M–1M.

10. A method of cleaning a silicon wafer as defined in claim 9, wherein the step of cleaning a silicon surface of the silicon wafer in the aqueous solution of hydrofluoric acid and hydriodic acid in the presence of oxygen and light is conducted for a period of time sufficient to substantially prevent the deposition of copper contaminants within the aqueous solution from being deposited onto the silicon surface of the silicon wafer while minimizing oxidation of the silicon surface of the silicon wafer while cleaning said silicon surface.

11. A method of cleaning a silicon wafer as defined in claim 9, wherein the silicon wafer is substantially entirely composed of silicon.

12. A method of cleaning a silicon wafer as defined in claim 9, wherein the aqueous solution of hydrofluoric acid and hydriodic acid has sufficient hydriodic acid to cause substantially no dissociation of the hydrofluoric acid.

13. A method of cleaning a silicon wafer comprising the steps of:
    cleaning the silicon surface of the silicon wafer in an aqueous solution of hydrofluoric acid and hydriodic acid in the presence of oxygen and light, the aqueous solution having a pH level of less than 1, for a period of time sufficient to substantially prevent copper contaminants within the aqueous solution from being deposited onto the silicon surface of the silicon wafer while cleaning said silicon surface, wherein the aqueous solution of hydrofluoric acid and hydriodic acid has a concentration of hydrofluoric acid of about 0.1M–10M and has a concentration of hydriodic acid of about 0.001M–1M.

14. A method of cleaning a silicon wafer as defined in claim 13, wherein the step of cleaning the silicon surface of the silicon wafer in the aqueous solution of hydrofluoric acid and hydriodic acid in the presence of oxygen and light is conducted for a period of time for a period of time sufficient to substantially minimize oxidation of the silicon surface of the silicon wafer.

15. A method of cleaning a silicon wafer as defined in claim 13, wherein the aqueous solution of hydrofluoric acid and hydriodic acid has sufficient hydriodic acid to cause substantially no dissociation of the hydrofluoric acid.

16. A method of cleaning a silicon wafer as defined in claim 13, wherein the silicon wafer is substantially entirely composed of p-type Si(100).

17. A method of cleaning a silicon wafer as defined in claim 13, wherein the silicon wafer is substantially composed of silicon.

18. A method of cleaning a silicon wafer as defined in claim 13, wherein the silicon wafer is substantially composed of p-type monocrystalline silicon.

* * * * *